(12) United States Patent
Liang et al.

(10) Patent No.: US 8,502,088 B2
(45) Date of Patent: Aug. 6, 2013

(54) SERVER ENCLOSURE

(75) Inventors: An-Gang Liang, Shenzhen (CN); Zheng-Heng Sun, Tu-Cheng (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 308 days.

(21) Appl. No.: 12/969,942

(22) Filed: Dec. 16, 2010

(65) Prior Publication Data

US 2012/0024591 A1  Feb. 2, 2012

(30) Foreign Application Priority Data

Jul. 29, 2010 (CN) .......................... 2010 1 0240047

(51) Int. Cl.
*H01R 13/46* (2006.01)
(52) U.S. Cl.
USPC ......................................................... 174/520
(58) Field of Classification Search
USPC ............ 174/520, 255, 260, 262; 361/679.01, 361/679.47, 679.48, 807, 809, 818
See application file for complete search history.

(56) References Cited

U.S. PATENT DOCUMENTS

| 6,363,232 | B1 * | 3/2002 | Flaherty | 399/106 |
|---|---|---|---|---|
| 2008/0080159 | A1 * | 4/2008 | Sun | 361/818 |
| 2010/0319681 | A1 * | 12/2010 | Li | 126/640 |
| 2011/0011019 | A1 * | 1/2011 | Stahl, et al. | 52/232 |
| 2011/0156595 | A1 * | 6/2011 | Sun | 315/152 |

FOREIGN PATENT DOCUMENTS

| CN | 101206507 A | 6/2008 |
|---|---|---|
| CN | 201197062 Y | 2/2009 |

* cited by examiner

*Primary Examiner* — Jeremy Norris
*Assistant Examiner* — Tremesha S Willis
(74) *Attorney, Agent, or Firm* — Altis Law Group, Inc.

(57) ABSTRACT

A server enclosure includes a housing, at least one cable, a partition board, and a sealing member. The partition board is securely received in the housing and defines a through hole through which the at least one cable passes. The sealing member plugs the through hole. The sealing member is made of elastic materials, and defines at least one elastic deformation portion through which the at least one cable passes and by which the at least one cable is clamped.

5 Claims, 6 Drawing Sheets

SERVER ENCLOSURE

BACKGROUND

1. Technical Field

The present disclosure relates to a server enclosure.

2. Description of Related Art

Cloud computing is internet-based computing in which shared resources, software, and information are provided to computers and other devices on demand. A server is needed to link other computers or electronic devices together, and store information for customers via the internet. High stability of the server is necessary.

A typical server enclosure includes a housing and a partition board received in the housing to reinforce the server enclosure. The partition board divides the housing into two portions. The partition board defines a through hole through which the cables pass to connect components disposed in different areas of the housing. The through hole is sufficiently large to protect the cables from abrasion.

However, the server enclosure has poor heat dissipation, because airflow in the two portions of the housing is affected by the through hole.

Therefore, there is room for improvement within the art.

BRIEF DESCRIPTION OF THE DRAWINGS

The components in the drawings are not necessarily drawn to scale, the emphasis instead being positioned upon clearly illustrating the principles of the present disclosure. Moreover, in the drawings, like reference numerals designate corresponding parts throughout the views.

DETAILED DESCRIPTION

Figure 1:
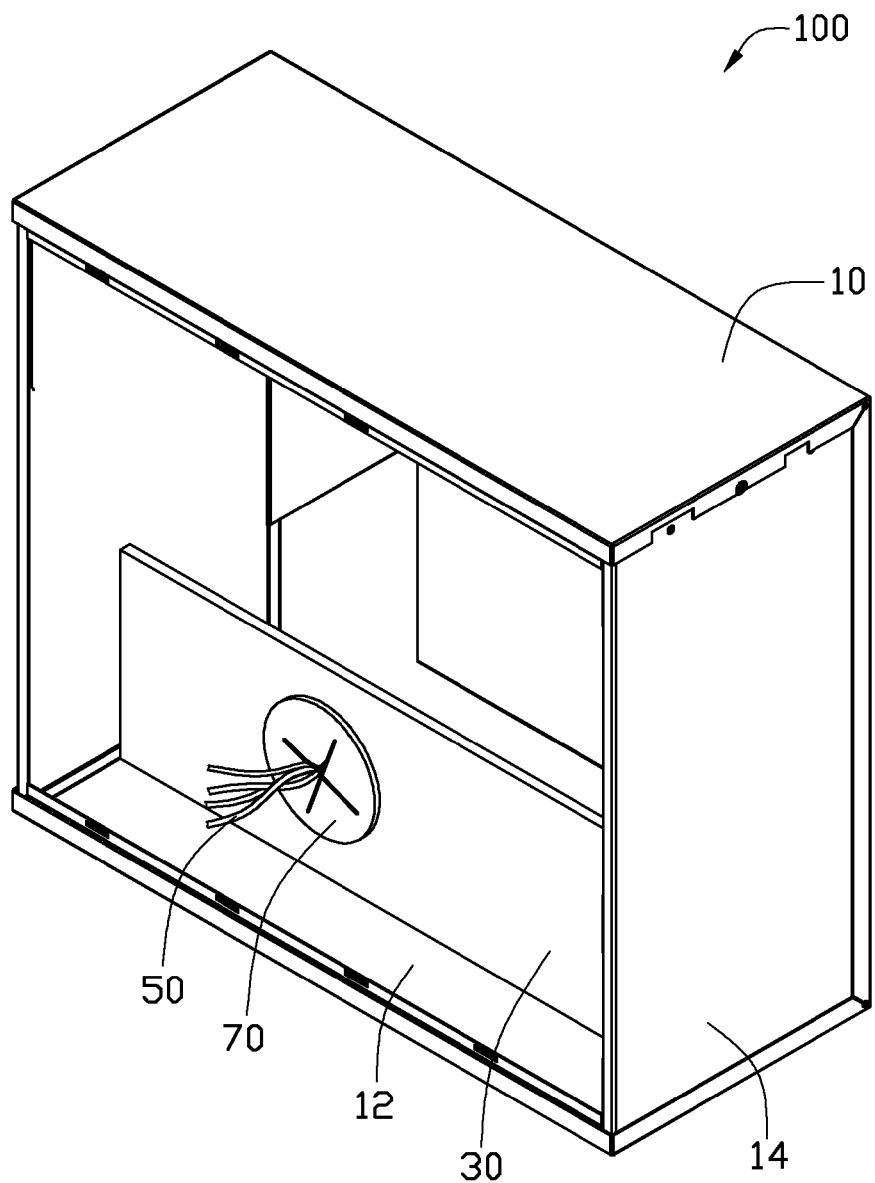
FIG. 1 is an isometric, assembled view of a first embodiment of a server enclosure, the server enclosure including a housing, a partition board, and a sealing member.
Figure 2:
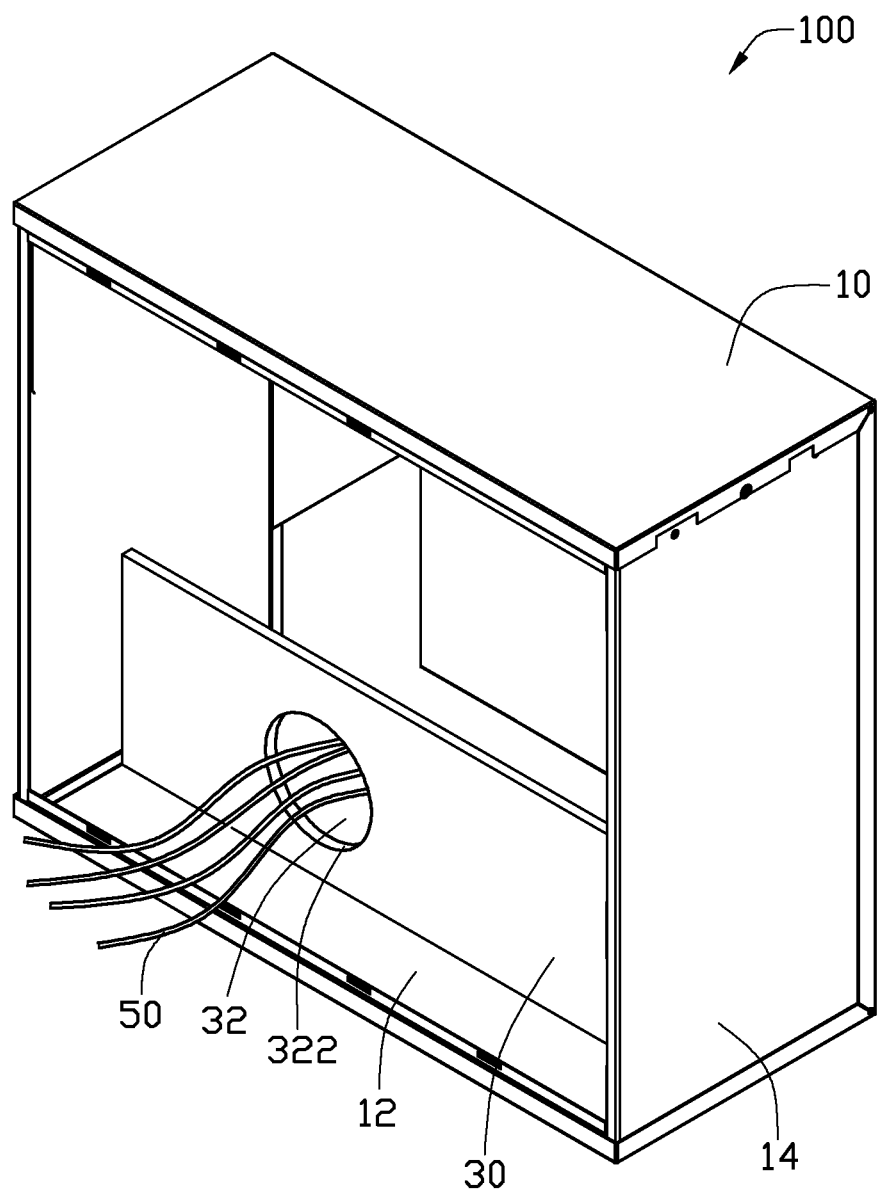
FIG. 2 is an isometric, assembled view of the housing and the partition board of FIG. 1.

Referring to FIG. 1 and FIG. 2, a first embodiment of a server enclosure 100 includes a housing 10, a partition board 30, a plurality of cables 50, and a sealing member 70. The partition board 30 is securely received in the housing 10.

The housing 10 includes a baseboard 12 and two sidewalls 14 extending from opposite edges of the baseboard 12. The partition board 30 is substantially rectangular and fixed on the baseboard 12. Two opposite ends of the partition board 30 are respectively connected to the two sidewalls 14. The partition board 30 defines a through hole 32 through which the cables 50 pass.

The cables 50 may be configured to connect a motherboard (not shown), a hard disk (not shown), and other electronic components disposed at opposite sides of the partition 30.

Figure 3:
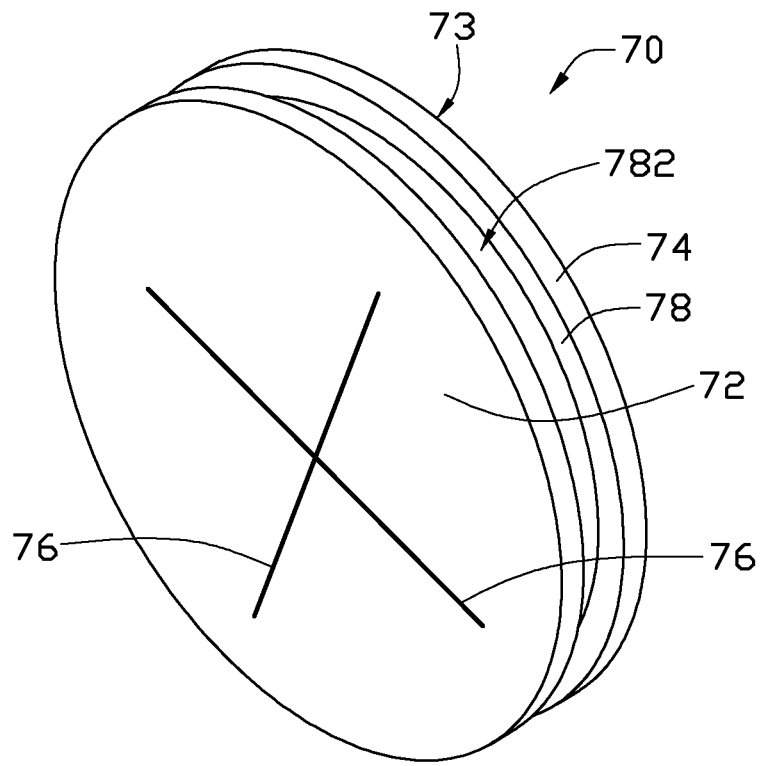
FIG. 3 is an enlarged, isometric view of the sealing member of FIG. 1.

Referring to FIG. 3, the sealing member 70 is substantially cylindrical, and made of elastic materials such as rubber or foam. In the illustrated embodiment, the sealing member 70 is made of foam. It should be pointed out that the sealing member 70 may be made of rubber. A diameter of the sealing member 70 exceeds that of the through hole 32. The sealing member 70 includes a first end surface 72, a second end surface 73, and a side surface 74 connecting the first end surface 72 and the second end surface 73. The sealing member 70 defines at least one elastic deformation portion 76. In the illustrated embodiment, the elastic deformation portion 76 is a slit extending through the first end surface 72 and the second end surface 73. The elastic deformation portion 76 is closed with no cable passing therethrough. In the illustrated embodiment, the sealing member 70 defines two elastic deformation portions 76 cutting across each other, enhancing capacity of deformation. The sealing member 70 further defines a mounting slot 78. The mounting slot 78 is annular, and depressed from a middle part of the side surface 74. The mounting slot 78 has a resisting surface 782. The resisting surface 782 is annular and coaxial with the side surface 74.

During assembly, the sealing member 70 is deformed and partly passes through the through hole 32 with the mounting slot 78 corresponding to the through hole 32, and the partition board 30 is partly received in the mounting slot 78. The resisting surface 782 of the mounting slot 78 resists a sidewall 322 (see FIG. 2) of the through hole 32 to fix the sealing member 70 to the partition member 70, and plug the through hole 32. The cables 50 pass through the elastic deformation portions 76. The elastic deformation portions 76 deformed by the cables 50, which, as a result, are clamped thereby.

The sealing member 70 can be made of plastic materials, such that the elastic deformation portions 76 are deformed to allow the cables 50 to pass therethrough, and the deformation portions 76 are restored to clamp the cables 50, and the deformation portions 76 keep good contact with the cables 50. As a result, the through hole 32 is well sealed by the sealing member 70 to improve the heat dissipating performance of the server enclosure 100. The cables 50 are clamped by the elastic deformation portions 76 to prevent abrasion.

Alternatively, one or more elastic deformation portions 76, rather than two, such as three elastic deformation portions, can be defined at the sealing member 70. The elastic deformation portions 76 are not limited to intersect, and may alternatively be parallel. The mounting slot 78 may be omitted, wherein the side surface 74 of the sealing member 70 resists the sidewall 322 of the through hole 32.

Figure 4:
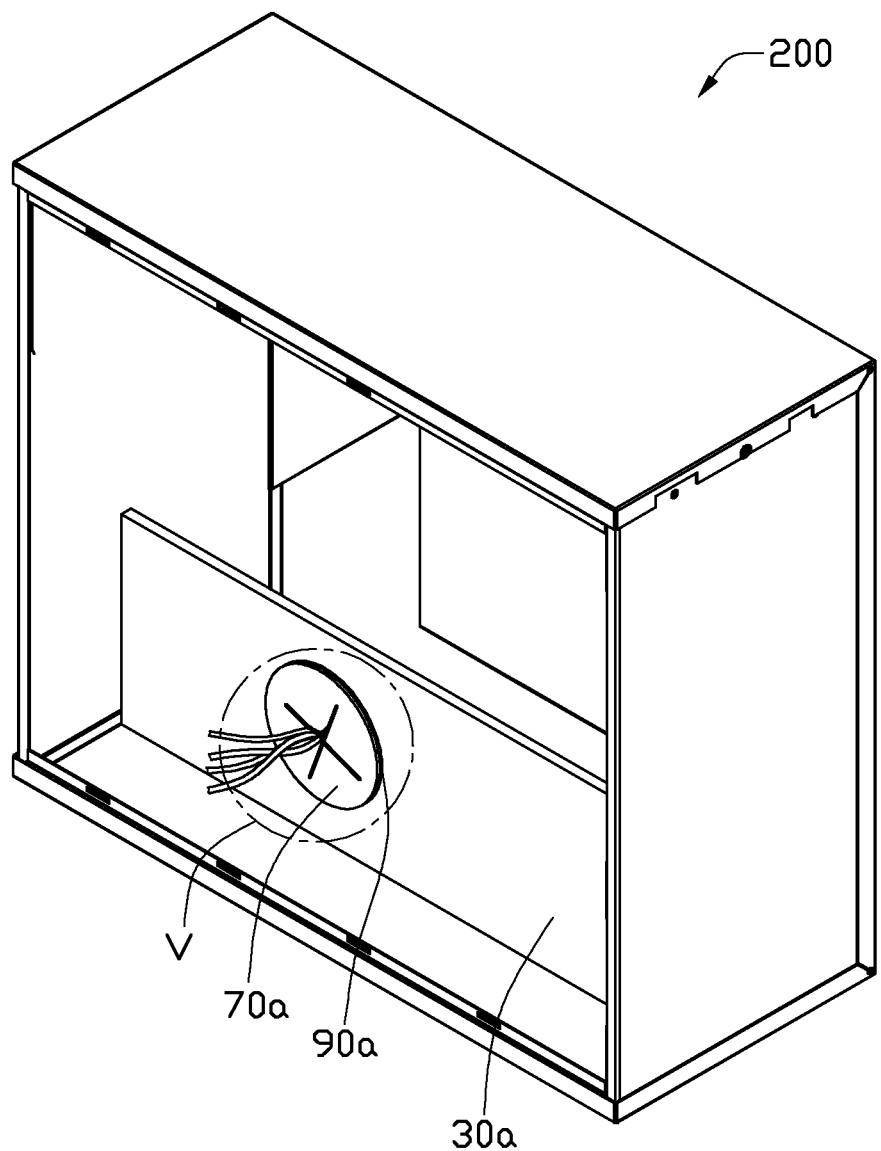
FIG. 4 is an isometric, assembled view of a second embodiment of a server enclosure.
Figure 5:
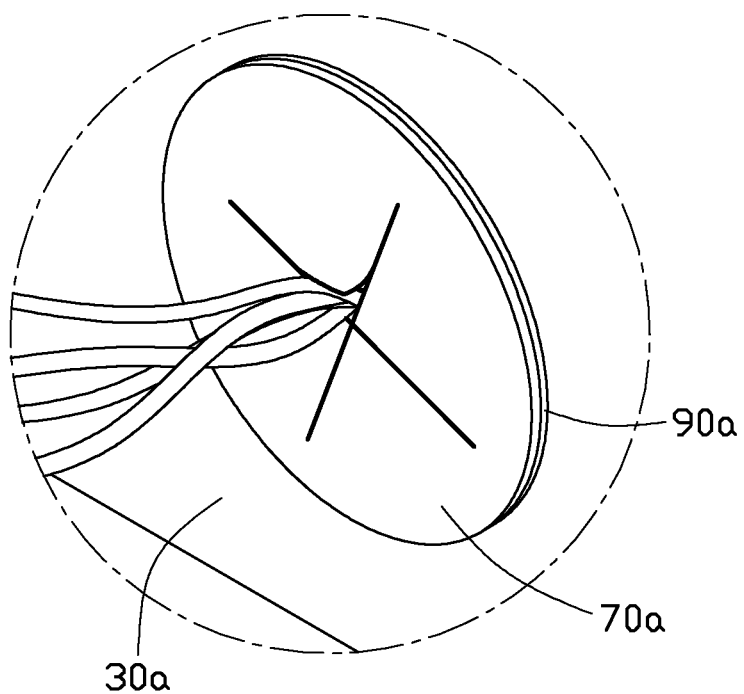
FIG. 5 is an enlarged view of a portion V of the server enclosure in FIG. 4.

Referring to FIG. 4 and FIG. 5, a second embodiment of a server enclosure 200 differs from the first embodiment of the server enclosure 100 only in that the sealing member 70a is fixed to the partition board 30a by a bonding film 90a, and the sealing member 70a covers the through hole (not shown).

Figure 6:
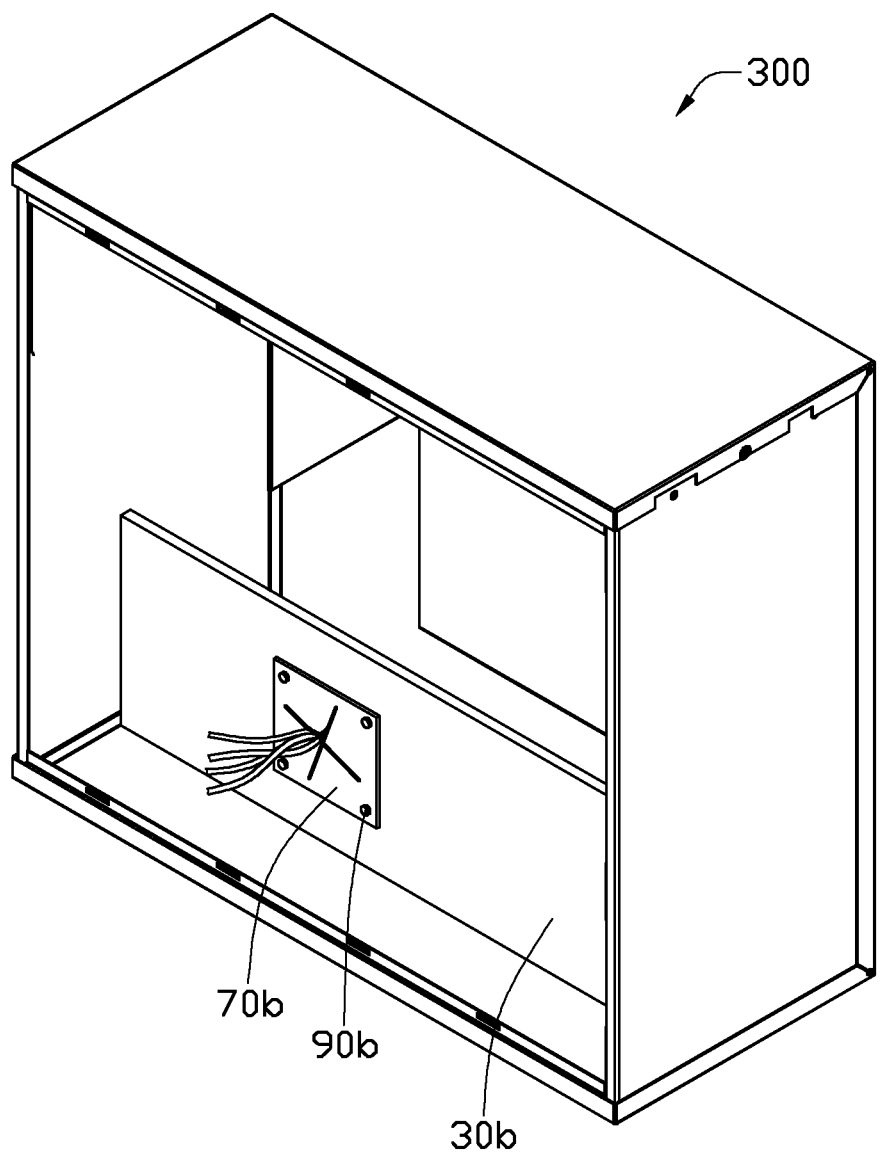
FIG. 6 is an isometric, assembled view of a third embodiment of a server enclosure.

Referring to FIG. 6, a third embodiment of a server enclosure 300 differs from the first embodiment of the server enclosure 100 only in that the sealing member 70b is fixed to the partition board 30b by a plurality of fasteners 90b, and the sealing member 70b covers the through hole (not shown). In the illustrated embodiment, the fasteners 90b are screws.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A server enclosure, comprising:
   a housing;
   at least one cable;
   a partition board securely received in the housing, the partition board defining a through hole for passing through the at least one cable; and
   a sealing member plugging in the through hole, wherein the sealing member is made of elastic materials and defines at least one elastic deformation portion to allow the at least one cable to pass through and clamp the at least one cable, the sealing member is substantially cylindrical and has a diameter of exceeding that of the through hole, the sealing member comprises a side surface and a mounting slot depressed from the side surface, the sealing member passes through the through hole with the side surface resisting a sidewall of the through hole, the partition board is partly received in the mounting slot.

2. The server enclosure of claim 1, wherein the elastic deformation portion is a slit defined at the sealing member.

3. The server enclosure of claim 2, wherein the sealing member defines at least two elastic deformation portions cutting across each other.

4. The server enclosure of claim 2, wherein the sealing member defines at least two elastic deformation portions substantially parallel to each other.

5. The server enclosure of claim 1, wherein the sealing member is made of foam or rubber.

* * * * *